United States Patent [19]

Nishiura

[11] 4,313,200
[45] Jan. 26, 1982

[54] LOGIC TEST SYSTEM PERMITTING TEST PATTERN CHANGES WITHOUT DUMMY CYCLES

[75] Inventor: Junji Nishiura, Gyoda, Japan

[73] Assignee: Takeda Riken Kogyo Kabushikikaisha, Tokyo, Japan

[21] Appl. No.: 69,345

[22] Filed: Aug. 24, 1979

[30] Foreign Application Priority Data

| Aug. 28, 1978 | [JP] | Japan | 53-105300 |
| Sep. 4, 1978 | [JP] | Japan | 53-108257 |
| Sep. 6, 1978 | [JP] | Japan | 53-123089[U] |
| Sep. 6, 1980 | [JP] | Japan | 55-110132 |
| Apr. 11, 1979 | [JP] | Japan | 54-43774 |
| Apr. 20, 1979 | [JP] | Japan | 54-49312 |

[51] Int. Cl.³ .......................................... G06F 11/22
[52] U.S. Cl. ...................................... 371/25; 371/20; 364/900
[58] Field of Search ... 364/200 MS File, 900 MS File; 371/24, 25, 26, 20

[56] References Cited

U.S. PATENT DOCUMENTS

| 3,497,685 | 2/1970 | Stafford et al. | 371/26 |
| 3,707,703 | 12/1972 | Sakai | 364/200 |
| 3,739,160 | 6/1973 | El-Hasan et al. | 371/25 |
| 3,764,995 | 10/1973 | Helf, Jr. et al. | 364/200 |
| 4,048,481 | 9/1977 | Bailey, Jr. et al. | 364/200 X |
| 4,084,262 | 4/1978 | Lloyd et al. | 364/900 |
| 4,108,359 | 8/1978 | Proto | 371/25 |
| 4,142,243 | 2/1979 | Bishop et al. | 364/900 |

Primary Examiner—James D. Thomas
Attorney, Agent, or Firm—Staas & Halsey

[57] ABSTRACT

A system for testing logical devices, in which a pattern file is used to store numerous test patterns, each of which includes both an input pattern, which is provided as an input to the device under test, and an expected value pattern, which is compared with the actual output of the device under test to ascertain whether malfunction has occurred. By accessing the pattern file at various addresses, different test patterns can selectively be applied to the device in a test. A command file includes instructions for controlling the sequence in which the various test patterns included in the pattern file are accessed, and an operand file includes data which may be required for carrying out the instructions contained in the command file. Index, stack point, and subroutine return registers are also used to execute the instructions which may be contained in the command file. In addition, provision of a mask data address file with associated structures permits similarly controlled selection of which terminals of the logical device under test are to be tested or disregarded. Thus, by executing a sequence of instructions which are stored in the command file, a very large number of possible test sequences can be executed, without ever interrupting the sequence of input patterns which are applied to the device under test.

15 Claims, 15 Drawing Figures

| ADDRESS | 24 OPERAND FILE | 23 COMMAND FILE | 11 PATTERN FILE |
|---|---|---|---|
| G | K | STP | |
| A−1 | n−1 | STI | |
| A | | | |
| A+1 | | | |
| H | | JSP | |
| H+1 | | | |
| I | | JSP | |
| I+1 | | | |
| B | A | JNI | |
| K | | RSP | |
| K+1 | | RSP | |
| K+2 | | RSP | |

| ADDRESS | EXPECTED VALUE | 24 OPERAND FILE | 23 COMMAND FILE |
|---|---|---|---|
| N | 1 | N | FLGS |
| N + 1 | 0 | N + 1 | FLGS |
| N + 2 | 1 | N | FLGS |
| N + 3 | 1 | N + 2 | FLGS |
| N + 4 | 1 | N + 2 | FLGS |
| N + 5 | 0 | N + 1 | FLGS |
FIG. 13
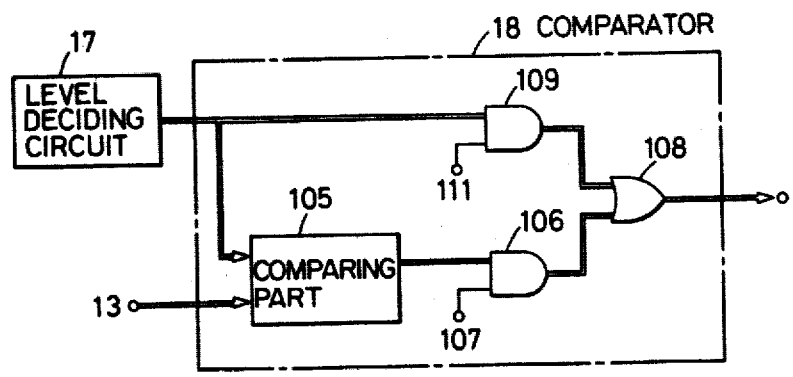
FIG. 14
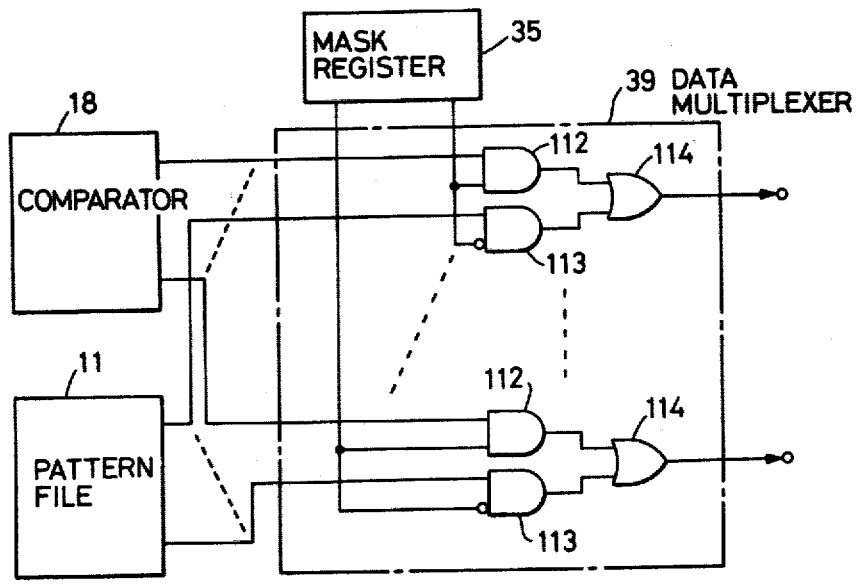
FIG. 15

LOGIC TEST SYSTEM PERMITTING TEST PATTERN CHANGES WITHOUT DUMMY CYCLES

BACKGROUND OF THE INVENTION

This invention relates to a logical device test system for testing logical devices such as, for example, a microprocessor, a semiconductor memory, a semiconductor integrated circuit composed of logical circuits and so forth.

In a system for testing of this kind, logical input patterns composed of various logical values, corresponding to a plurality of terminals of the device under test, are applied thereto, and the outputs, i.e. output patterns derived from a plurality of output terminals of the device under test, are compared with expected value patterns which are to be obtained when the device under test operates normally, thereby checking whether the logical element operates normally or not. In this case, if the logical device under test is one having complicated functions, for example, a microcomputer, it is necessary to conduct various tests by applying a number of input patterns to the logical device under test. In the prior art, the input patterns and the expected value patterns corresponding thereto are prestored in a pattern file, the input patterns are successively read therefrom to be input to the logical device under test, and the resulting output patterns therefrom are respectively compared with the expected value patterns. In the conventional equipment, the required test pattern storage capacity for the input patterns and the expected value patterns, is enormous.

Also in the past, attempts have been made to reduce the required storage capacity of the pattern file for storing the test patterns. A series of test patterns, which can be successively read out, includes those of the so-called pattern pause test, which repeatedly applies the same input pattern to the logical device under test a plurality of times, and the pattern loop test which repeatedly applies a plurality of successive input pattern groups to the logical device under test. In such a case, the following method has been adopted for reducing the storage capacity for the test patterns: Namely, in the pattern loop test, leading and last addresses of the pattern loop are prestored in a register, and the number of times of looping is also prestored in another register. When the content of a program counter for the pattern file having stored therein the test patterns coincides with the last address of the loop stored in the register, the coincidence is detected, and the content of the program counter is set at the leading address of the loop stored in the register, and one is subtracted from the content of the register having stored therein the number of times of looping; these operations are repeatedly carried out to repeat reading of each address between the leading and the last addresses the preset number of times. To this end, there is inserted in the program of the test pattern a program for writing the leading and last addresses of the pattern loop test and the number of times of looping in registers. While they are written in the registers, the test of the logical device under test is interrupted, and this period of interruption idles to the logical device under test; that is, the so-called dummy cycle occurs. In the case of conducting the pattern pause test, a program for writing the address therefor and the number of pattern pauses in registers is inserted in the program of the test pattern, and they are written in the registers by executing the program, so that during the execution, a dummy cycle occurs. The occurrence of such a dummy cycle sometimes causes not only an increase in the test time but also a change in the state of the logical device under test during the dummy cycle in the case of some particular logical devices, resulting in the test becoming incorrect.

Accordingly, it is an object of this invention to provide a logical device test system which permits a pattern loop test, a pattern pause test or more complicated tests without generation of a dummy cycle.

Conventional test systems of this type may in some cases repeat the same test step while modifying one part of the control procedure for the test. For example, in the case of adding together two data to obtain the result of addition, it happens sometimes to repeat the test while successively modifying only one of the data; in this case, only one of the data is modified, but the other data is held unchanged. In the prior art, however, even in the case of repeating the same test patterns, if the data (pattern) of its address is altered, no pattern test can be conducted, and to avoid this, these same patterns are sequentially stored in a pattern file; therefore, the storage capacity of the pattern file is required to be large.

Another object of this invention is to provide a logical device test system in which is the case of substantially the same test patterns being repeated, both invariable fixed test patterns and variable test patterns modified for each cycle of the test are stored, thereby reducing the required storage capacity of the pattern file.

Another object of this invention is to provide a logical device test system which permits the insertion of a test pattern of a variable content in fixed test patterns.

In some logical devices under test, the test operation cannot be allowed to proceed until their output reach a certain state; in the test of this type of the logical device, such an arrangement is made that, if the output pattern from the logical device under test and the expected value pattern therefore are not detected coincident, the test operation does not proceed to the next step. In this case, when coincidence is detected between the output pattern from a predetermined one of the output terminals of the logical device under test and the expected value pattern corresponding thereto, the test is permitted to proceed to the next step, and in addition, designation of the output terminal is modified. In the prior art, data for designating the output terminal of the logical device under test to be checked for coincidence with the expected value pattern, that is, the so-called mask data is stored in the pattern file at the same addresses as those from which the test patterns are read out; namely, a storage area for the mask data is always provided in each address of the pattern file. Accordingly, the pattern file is required to have a storage capacity for the number of bits of the mask data and the number of addresses of the pattern file, resulting in an appreciably large storage capacity.

In such a test in which the test operation proceeds to the next step only after coincidence is detected between the output pattern from the logical device under test and the expected value pattern, there is a possible further requirement that the test operation proceeds to the next step not merely if the case of the coincidence being detected once but only if is also detected in each of a plurality of succeeding test steps, that is, in the case of the output patterns from the logical device being detected coincident with predetermined patterns in the direction in which the test steps proceed. For conducting such a test, in the prior art, expected value patterns in the direction of the test step proceeding are stored in a register, and the outputs from the logical device under test for respective steps are sequentially applied to a shaft register, and coincidence is detected between the contents of the two registers. Such coincidence detection is needed for each of predetermined output terminals, resulting in an increased amount of hardware.

Another object of this invention is to provide a logical device test equipment in which, when performing a coincidence detecting test in the direction of progress of the test, the depth of the output pattern (i.e. its length on the sequential direction) can freely be altered to provide for enhanced flexibility and to enable a complicated test.

Another object of this invention is to provide a logical device test system which permits easy designation of output terminals and enables a required test with a small storage capacity for mask data for the output terminal designation.

In order to locate malfunction of the logical device under test or analyze the cause of malfunction in the case of non-coincidence between the output pattern from the logical device under test and the expected value pattern, a compared pattern indicating the compared result is stored in the so-called fail memory, and after completion of the test, the stored result is read out and analyzed using the input pattern corresponding thereto. Since only compared patterns at the time of non-coincidence are stored in the fail memory, the compared patterns must be coordinated with the input patterns, and this coordination is relatively complicated. Further, the provision of the fail memory for the above purpose increases the amount of hardware required. Moreover, the compared patterns stored in the fail memory are those obtained only in connection with predetermined output terminals of the logical device under test, so that the so-called mask data is employed. In the prior art, the mask data is stored in the pattern file at each address; therefore, the storage capacity for the mask data is large.

Another object of this invention is, therefore, to provide a logical device test system which is capable of storing compared patterns without the necessity of specially providing a fail memory, and which readily provides the coordination between the stored compared patterns and input patterns, thereby facilitating an analysis of the test result.

Another object of this invention is to provide a logical device test system which is capable of storing, with a small storage capacity, mask data for taking out compared patterns at designated output terminals respectively corresponding thereto when storing the compared patterns.

In the prior art, output patterns which are derived from an accepted logical device under test by successively applying input patterns are used as expected value patterns, and these expected value patterns are sequentially written in the pattern file at the addresses of the input patterns corresponding to them. In this case, since the output terminals at which the output patterns are provided vary with test steps, the output patterns are written in all bits of each address of the pattern file. In other words, the output patterns are written in those areas of the pattern file in which the input patterns are already written; consequently, the input patterns are erased, and it is necessary to re-write the corresponding input patterns in the pattern file from the outside after storing of the expected value patterns. Therefore, it takes a relatively much time to obtain test patterns composed of input and expected value patterns in pairs.

Another object of this invention is to provide a logical device test system which is capable of writing expected value patterns in the pattern file without erasing input patterns corresponding thereto, and hence is able to provide test patterns in a short time and to reduce the time for the so-called copy.

Some logical devices under test use their terminals both as input and output terminals on a time-shared basis. A method that has been employed for testing such logical devices is as follows: Prior to applying input patterns to the logical device under test, input/output control data indicating which terminals of the logical device are used as input and output terminals respectively and, if necessary, mask data representing which one of the designated terminals is required, with the other terminals ignored, are respectively read from the pattern file one by one for each step of the program counter, and are stored in an input/output control register and a mask register. After completion of storing of these data, each terminal of the logical device under test is controlled by the input/output control data to act as an input or output terminal, and the mask data determine whether the terminal is to be ignored or not; in such a state, the input patterns are each applied to the logical device under test, and the output pattern therefrom and the expected value pattern corresponding thereto are compared. In this case, since one step of the program counter is used for reading out each of the input/output control data and the mask data, no test is conducted in this period, resulting in a dummy cycle. Some kinds of logical devices change their output status during such dummy cycle and hence cannot correctly be tested. Further, it is necessary to increase the speed of the operation cycle of the pattern file twice or three times as high as the operation cycle of the logical device under test; this increases the cost of the equipment.

Still another object of this invention is to provide a logical device test system which is capable of producing, without occurrence of a dummy cycle, input/output control data for a logical device having input/output terminals and, if necessary, mask data for determining whether data of a designated one of the terminals is to be considered or ignored, and which is able to reduce the required storage capacity for these data and hence is inexpensive accordingly.

SUMMARY OF THE INVENTION

According to the present invention, in a logical device test system in which test patterns, each composed of at least an input pattern and an expected value pattern, are selectively read from a pattern file at an address assigned in accordance with the content of a program counter, the read-out input pattern is applied to a logical device under test, and the output pattern therefrom and the read-out expected value pattern are compared in a comparator; instructions for controlling the pattern generation sequence are stored in a command file; data for the instructions, for example, the number of times of jump, the destination of and leading address of jump and so forth, is stored in an operand file at addresses respectively corresponding to the instructions of the command file; and addresses for reading out mask data representing whether each terminal of the logical device under test is selected or not, that is, whether output data from the terminal is used or data is applied thereto, and whether the compared output from a comparator corresponding to the output terminal is taken out or not, are stored in a mask data address file. In a similar manner, addresses for reading out input/output control data for designating an input/output terminal of the logical device under test as an input or output terminal are stored in an input/output data file.

The command file, the operand file, the mask data address file and the input/output data address file are simultaneously read out at an address assigned in accordance with the content of the program counter of the pattern file corresponding to each address of the pattern file. By the address read from the mask data file, the mask data file is address-assigned and read out to select the terminal of the logic7l device under test and the compared output corresponding thereto. By storing the mask data as mask data addresses in this way without storing it for each address of the pattern file, the storage capacity can be reduced. Likewise, the mask data is employed for the selection of a bit that coincidence is to be detected between the output pattern and the expected value pattern in the case where the test operation proceeds to the next step when the coincidence is detected.

The input/output control data file is read out at an address assigned by the address read from the input/output control data address, and by the input/output control address thus read out, each terminal of the logical device under test is controlled to serve as an input or output terminal. Also in this case, the storage capacity for the input/output control data can be made smaller than the storage capacity needed for storing such data in the pattern file at each address. On top of that, the input/output terminals of the logical device under test are controlled without occurrence of a dummy cycle.

Further, in the case of controlling the sequence of generation of test patterns, required instructions are prestored in the command file, and required data is prestored in the operand file at the same addresses as the instructions. For example, in a pattern loop test, an instruction representing the pattern loop test is read from the command file prior to the test, and when this instruction is decoded, the number of times of looping read from the operand file at that time is loaded into an index register. Moreover, a jump instruction is prestored in the command file at the last address of the pattern loop, and the leading address of the loop is prestored in the operand file at the same address as the jump instruction. Accordingly, when reading of the pattern proceeds to the last address of the loop, the jump instruction is detected, and the leading address of the loop read from the operand file at that time is set in the program counter, and at the same time, the content of the index register is subtracted by one. Once the content of the index register becomes zero as a result of repetition of such operation, even if the jump instruction is detected when the program counter reaches the last address of the pattern loop, the program counter advances by one step without jumping. In this way, the pattern loop test is conducted.

Accordingly, there is no need of inserting in the pattern file a program for processing necessary for performing the pattern loop test during the program being read from the pattern file; namely, the pattern loop test is automatically conducted, with the pattern file being read out for testing the logical device under test, and the test can be achieved without a dummy cycle.

It is also possible to perform a pattern pause test or a kind of subroutine which jumps from a certain address to another and from there reads out a series of addresses and then returns to the address next to that from which the operation jumped. Further, such a subroutine can also be repeated of plurality of times by setting suitable data in the instructions to be stored in the command file and in the operand file. In such a case, in order to ensure the operation that returns to the previous address or the address next thereto, the content of the program counter is set aside in a register.

Further, test patterns modified for each reading can also be inserted between some addresses of the pattern file; that is, in the pattern loop test, the contents of a predetermined one or more of test patterns can be modified for each loop. Also in this case, instructions and data are prestored in the command file and the operand file in accordance with the contents of the test patterns; a variable pattern area is provided in the pattern file; and the leading address is written in a stack point register by an instruction. When the test proceeds to a predetermined address, the content of the stack point register is set in the program counter, and the test pattern corresponding to the set content is read out, and the content of the stack point register is added with one when the operation returns to the address next to that from which the operation jumped. Consequently, when the address at which the test pattern is modified next is reached, the address next to the leading address is read out. Such a test can also be conducted without a dummy cycle; in addition, by such modification of one part of the pattern loop, the storage capacity for storing the test pattern can markedly be reduced as a whole.

Also in such a case where the test operation does not proceed to the next step unless the output from the logical device under test becomes of a predetermined state, an instruction indicating such an operation is prestored in the command file so that the operation returns to the same address whenever the output is not in the predetermined state, or in the case of coincidence detection in the direction of progress of the test step, the operation is caused to return to the leading address step where a coincidence has been detected.

A required bit of a compared pattern resulting from a comparison between the output pattern from the logical device under test and the expected value pattern is written, together with the corresponding input pattern in the pattern file at the address of the input pattern; consequently, the pattern file can also be used as a fail file, and since the input pattern and the compared pattern corresponding thereto can simultaneously read from the pattern file, the test result can easily be analyzed.

Moreover, an output pattern obtained by using an accepted product as the logical device under test is written, together with the input pattern used, in the pattern file memory at the address of the input pattern, so that the test pattern composed of the input pattern and the expected value pattern can be obtained by one test in the pattern file without erasing the input pattern.

BRIEF DESCRIPTION OF THE INVENTION

FIG. 13 is a diagram showing an example of storage of an output pattern, an expected value pattern and the command file in a test in which coincidence is detected in the direction of progress of test steps;

FIG. 14 is a diagram illustrating an example of a comparator 18 in FIG. 1; and

FIG. 15 is a logical circuit diagram illustrating an example of a data multiplexer 31.

DESCRIPTION OF THE PREFERRED EMBODIMENTS

Figure 1:
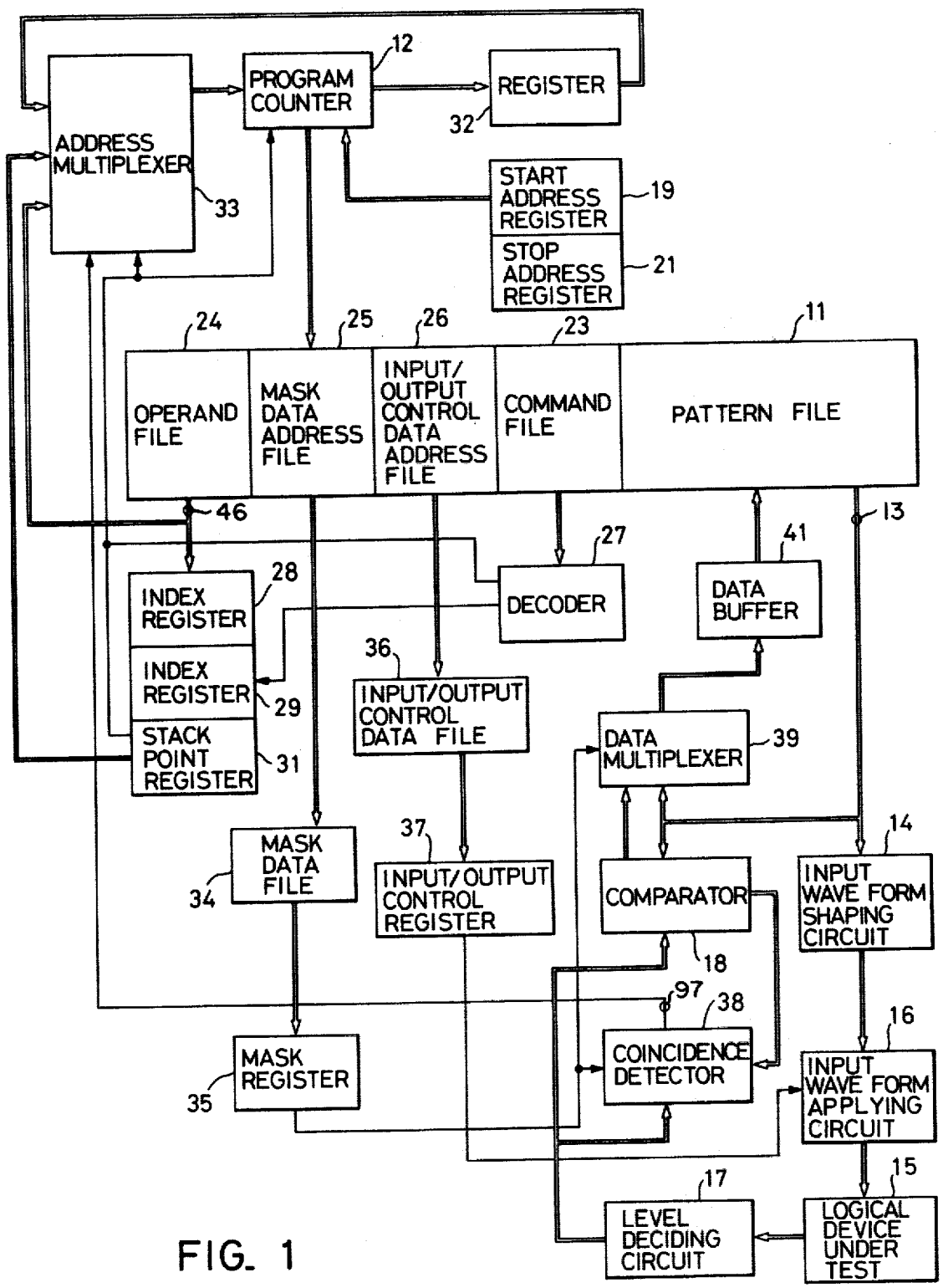
FIG. 1 is a block diagram showing an embodiment of the logical device test equipment of this invention.

FIG. 1 shows the outline of the logical device test equipment of this invention. Reference numeral 11 indicates a pattern file which has stored therein test patterns, each composed of at least a pattern for input to a device under test and an expected value pattern. The pattern file 11 is read at an address assigned in accordance with the content of an program counter 12. The test pattern thus read out is supplied via a terminal 13 to an input waveform shaping circuit 14, wherein the pattern for input to the device under test is shaped, for example, into RZ (Return to Zero), NRZ (Non-Return to Zero) or like waveform having a desired pulse width and/or pulse phase, necessary for input to a logical device 15 under test. The pattern thus waveformshaped by the waveform shaping circuit 14 is provided to the logical device 15 under test after being converted by an input waveform applying circuit 16 to a level necessary for input to the logical device 15 under test. In general, the input pattern is composed of a plurality of bits, which are applied to input terminals of the logical device under test respectively corresponding thereto.

When supplied with the input pattern, the logical device 15 under test performs a logical operation of its own function, and the result of operation is provided to a level deciding circuit 17, wherein it is decided whether the output from each terminal of the logical device 15 under test is above or below a predetermined voltage level, that is, whether the logic of each output is "1" or "0". The output pattern thus decided is supplied to a comparator 18, wherein corresponding bits of the output pattern and the expected value pattern, read from the pattern file 11 simultaneously with reading therefrom of the input pattern corresponding to the output pattern, are compared to check whether or not they are coincident with each other. A start address register 19 has stored therein an address for starting the test, which address is loaded into the program counter 12 at the start of operation. A stop address register 21 has stored therein an address of the pattern file 11 for stopping the operation; in the case of coincidence between this address and the content of the program counter 12, the test system is stopped from operation.

In the present embodiment, there are provided a command file 23, an operand file 24, a mask data address file 25 and input/output control address file 26 each of which is accessed at the same time as and at the same address as the pattern file 11. The command file 23 has stored therein micro instructions for controlling the sequence of pattern generation, and the instructions read from the command file 23 are decoded by a decoder 27. The operand file 24 has stored therein data for instructing the command file, such as, for example, the number of loops or pauses, jump destination addresses and so forth. Accordingly, the instruction of each address of the command file 23 corresponds to the data of the same address of the operand file. The instruction of the command file 23 is read therefrom and decoded by the decoder 27, and in accordance with the result of decoding, data read from the operand file 24 is written in index registers 28 and 29 or a stack point register 31, or control is made to subtract one from or add one to the content thus written. The index registers 28 and 29 have stored therein the number of pattern pauses or pattern loops. The stack point register 31 has stored therein a leading address for modifying one part of the test pattern to form a pattern loop. In the execution of a subroutine instruction, the content of the program counter 12 (or the content plus one) is loaded into a register 32. In accordance with the instruction decoded output from the decoder 27, an address multiplexer 33 is controlled to set in the program counter 12 the output from the operand file 24, the content of the stack point register 31 or the content of the register 32. The program counter 12 is always advanced for each operation cycle of this equipment, that is, for each step of the test.

The address read from the mask data address file 25 is provided to a mask data file 34 to assign its address, reading therefrom mask data, which is placed in a mask register 35. In accordance with the content of the mask register 35, the outputs from comparator 18 are controlled to determine which one or ones of the compared outputs for the output terminals of the logical device 15 under test is taken out. Accordingly, the mask data file 34 has stored therein mask data for taking out data only from unmarked terminals to be compared out of the plurality of the terminals of the logical device 15 under test.

An input/output control data file 36 is read at an address assigned by the address read from the input/output control address file 26, and the data thus read out is loaded into an input/output control register 37. The content of the register 37 is to achieve such control that designates the terminals of the logical device 15 under test [as input or output terminals in the case of the logical element 15 under test] as input or output terminals in the case of the logical device 15 being of the type using its terminals both as input and output terminals. The input/output control data of the register 37 is imparted to the input waveform applying circuit 16, and in the case of using the terminals of the logical device 15 under test as input terminals, the bit outputs of the input waveform applying circuit 16 corresponding to the input/output control data is selected to apply the input pattern to the logical device 15 under test, whereas in the case of the terminals of the logical device 15 being designated as output terminals, the impedance of the input waveform applying circuit 16 is made high so that the data from the logical device 15 under test is supplied to the comparator 18.

A coincidence detector 38 is provided for detecting coincidence between the output pattern of the logical device 15 under test and a predetermined expected value pattern, and until this coincidence is detected, the test pattern generation does not proceed to the next stage. That is, the output from the level deciding circuit 17 and the expected value pattern from the pattern file 11 are compared by the coincidence detector 38, and in the case of coincidence, the address multiplexer 33 is controlled by the output from the coincidence detector 38. For the formation of the expected value patterns, it is possible to use an accepted product as the logical device 15 under test and to write its output patterns as the expected value patterns in the pattern file 11 at the addresses respectively corresponding to the input patterns. To perform this, a data multiplexer 39 is provided. The data multiplexer 39 is assigned for each bit by the content of the mask register 35, and a designated one of the output patterns from the logical element 15 under test is taken out as the expected value pattern, which is combined with the input pattern read from the pattern file and then applied to a copy data buffer register 41. The content of the buffer register 41 is written in the data file 11.

Next, a specific operative example of the test equipment of FIG. 1 will be described in detail with regard to its operation and arrangement. Upon starting of the test equipment, the start address stored in the start address register 19 is set in the start address program counter 12. By the address thus set in the program counter 12, the pattern file 11, the command file 23, the operand file 24, the mask data address file 25 and the input/output control address file 26 are simultaneously accessed and read out. The input pattern read from the pattern file 11 is, as described previously, provided via the waveform shaping circuit 14 and the waveform applying circuit 16 to the logical device 15 under test. The output from the logical element 15 under test is level-decided by the level deciding circuit 17 and then compared with the readout expected value pattern in the comparator 18 to check whether the output pattern from the logical device 15 under test is correct or not. Upon each application of the input pattern, the address of the program counter 12 is advanced by one step; in this way, addresses of each of the files 11 and 23 to 26 are read out one after another.

Figure 2:
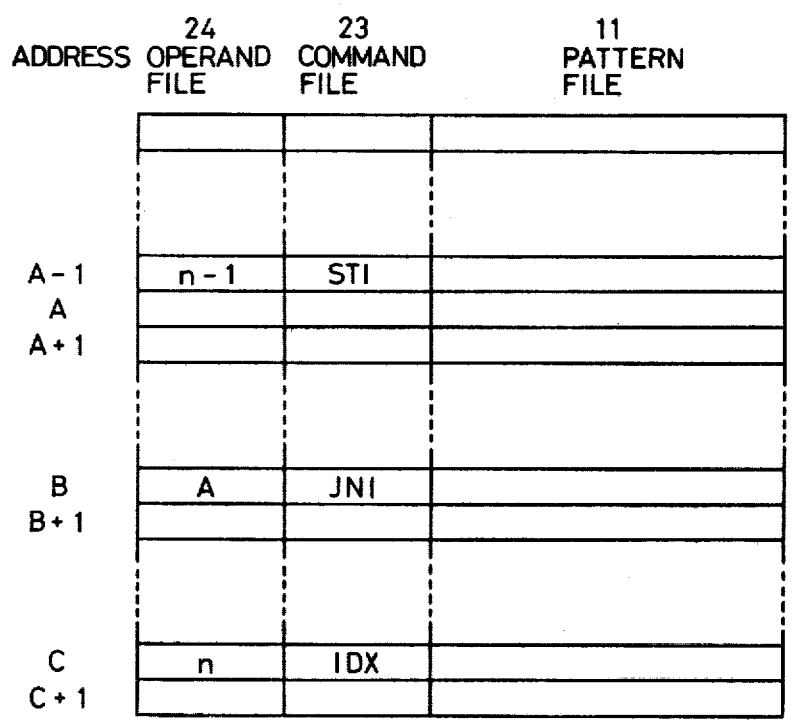
FIG. 2 is a diagram showing an example of each of a command file and an operand file in a pattern loop test and a pattern pause test.
Figure 3:
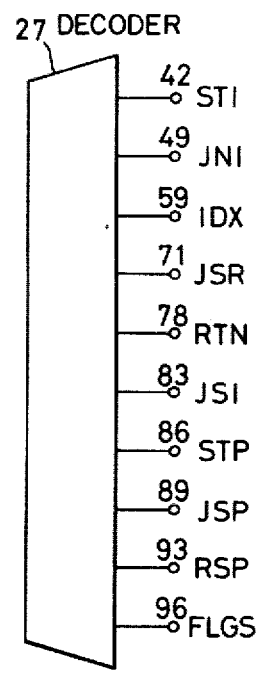
FIG. 3 is a diagram showing output terminals of a decoder 27 respectively corresponding to respective instructions in FIG. 1.
Figure 4:
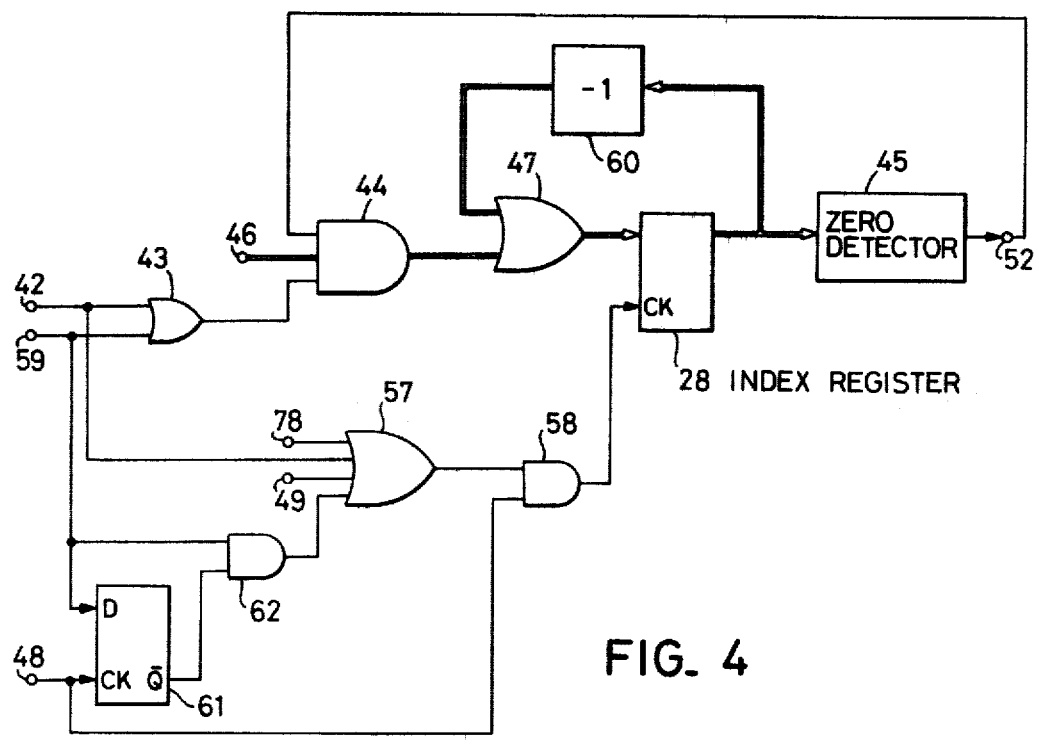
FIG. 4 is a logical circuit diagram illustrating an example of a control part corresponding to an index register 28 in FIG. 1.

Referring now to FIG. 2, a description will be given of the case where a pattern loop test is made, that is, the case where two addresses of the pattern file 11 are read out a plurality of times. When a pattern loop test program has reached an address A-1 immediately preceding a leading address A of a pattern loop, a set instruction STI for the index register is stored at an address A-1 of the command file 23, and the number of loop n-1 is stored as data corresponding to the set instruction STI at an address A-1 of the operand file 24. Consequently, when the contents of the addresses A-1 are read out, the logical device 15 under test is by the input pattern and the expected value pattern read from the pattern file 11, as mentioned previously, and at the same time, the set instruction STI for the index register is decoded by the decoder 27 to derive an output at its output terminal 42 (see FIG. 3). As shown in FIG. 4, the decoded output is provided via an OR gate 43 to an AND gate 44, which is also supplied with a zero detection output from a zero detector 45 and the read output from the operand file 24 via a terminal 46. Accordingly, data n-1 read from the operand file 24 is applied to the index register 28 via the gate 44 and an OR gate 47. A second clock signal $CK_2$, which is delayed in phase behind a first clock signal $CK_1$ for slepping the program counter 12, is applied via a terminal 48 to an AND gate 58, which is also supplied with the decoded output of the instruction STI from the terminal 42, so that the second clock signal $CK_2$ is provided via the gate 58 to a set terminal of the index register 28, and by this clock signal $CK_2$, the data n-1 read from the operand file 24 is set in the index register 28. In the state that the data n-1 is set in the register 28, the content of the register 28 takes a value other than zero in the zero detector 45; consequently the output from the detector 45 becomes low-level to close the AND gate 44.

Figure 5:
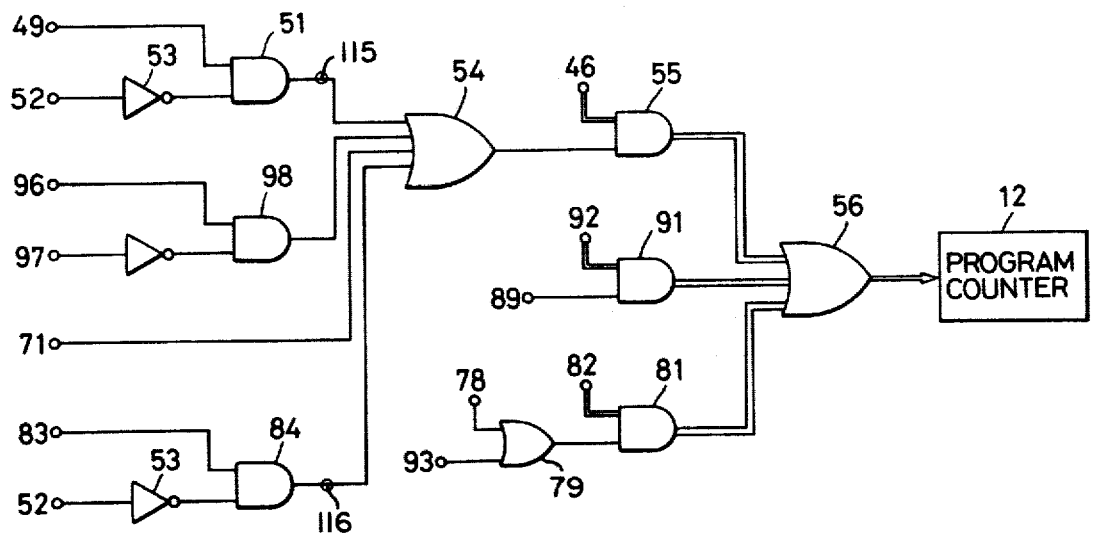
FIG. 5 is a logical diagram illustrating an example of an address multiplexer 33 in FIG. 1.
Figures 7, 8:
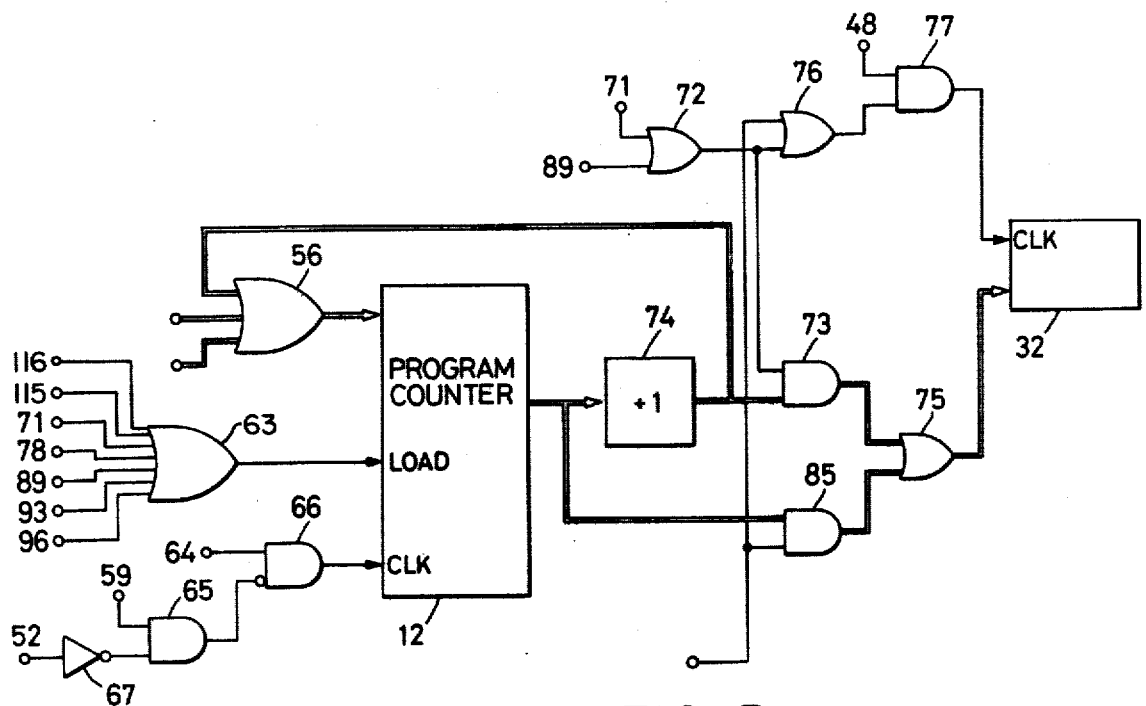
FIG. 7 is a logical diagram illustrating, by way of example, the vicinities of a program counter and a register 32 in FIG. 1.
FIG. 8 is a diagram showing an example of storage of each of the command file and the operand file in a subroutine repeating test.

Next, the program counter 12 steps forward to an address A, and the input pattern is applied to the logical device 15 under test, and then the output pattern therefrom is compared with the expected value pattern; thereafter, the pattern 11 is successively read out to perform tests. At the last address B of the loop, a jump instruction JNI is stored in the command file 23, and the leading address A of the loop is stored in the operand file 24. When the program counter 12 reaches the address B of the loop, the content of the address B is read out, and the test using the test pattern stored in the pattern file 11 is performed. At the same time, however, the jump instruction JNI is decoded by the decoder 27 to provide the decoded output at its output terminal 49, and as shown in FIG. 5, the decoded output is supplied to the AND circuit 51 in the address multiplexer 33, the AND circuit 51 being supplied with an inverted output (via an inverter 53) from an output terminal 52 of the zero detector 45 in FIG. 4. Accordingly, the AND circuit 51 detects coincidence between the both inputs thereto and yield a high level at terminal 115, which is provided via an OR circuit 54 to an AND circuit 55, which has been supplied, via the terminal 46, with the address A read from the operand file 24 and the address A is imparted via an OR gate 56 to the program counter 12. As depicted in FIG. 7, the decoded output of the jump instruction JNI obtained at the terminal 115 [from the terminal 49] is also applied via on OR gate 63 to a load terminal of the program counter 12, and by the first clock signal $CK_1$ provided from a terminal 64 via a gate 66 to the clock terminal of the program counter 12, the output from the OR gate 56, that is, the address A in this case, is preset in the program counter 12. In this manner, at the last address B of the loop, the program counter 12 is set at the leading address A of the loop unless the content of the index register 28 is zero, and upon each occurrence of the clock signal $CK_1$, the program counter 12 advances by one step, with the result that the pattern file 11 is successively read out again from the address A. When the last address B of the loop is read out, the decoded output of the address A is provided at the terminal 49 and supplied via an OR gate 57 to an AND gate 58, so that the second clock signal $CK_2$ from the terminal 48 is applied via the AND gate 58 to the index register 28. At this time, since the zero detector 45 is not detecting zero, the AND gate 44 remains closed, and as a result, one is subtracted from the content of the index register 28 in a-1 subtractor 60 to provide n-2, which is set in the index register 28 via the OR gate 47. In this way, the addresses A to B of each file are repeatedly read out, and each time the address B is reached, the content of the index register 28 is subtracted by one, and when the addresses A to B has been read out n-1 times, the content of the index register 28 becomes zero. That is, reading starts with the address A from the nth time, and even if the jump instruction JNI is read out when the last address B of the loop is read out, the output from the zero detector 45 is high-level, so that the address A is not set in the program counter 12. As a consequence, the program counter 12 has its content added with one and proceeds to the next address B+1. In this manner, the pattern loop test takes place, and on top of that, for the pattern loop test, the test pattern can always be applied to the logical device 15 under test for each operation cycle; namely, the test can be conducted without the necessity of providing any dummy cycle. Accordingly, there is no fear that correct tests cannot be achieved due to a change in the state of the output from the logical device 15 under test. Further, if the index register 29 is also included in the pattern loop, it is possible to perform a double pattern loop operation by conducting a pattern loop operation somewhere between the addresses A and B in the pattern loop. Moreover, by increasing the number of index registers, a multiple pattern loop test can also be achieved.

Next, a description will be made of the case where a pattern pause test is conducted. For example, as shown in FIG. 2, at an address C where a pattern pause test is conducted, a pattern pause instruction IDX is stored in the command file 23 at its address C, and the number of times n of the pattern pause being made is stored in the operand file 24 at its address C. When the content of the address C is read out, the pattern pause instruction IDX is decoded by the decoder 27 to provide at its output terminal 59 the decoded output, which is supplied via an OR gate 43 to the AND gate 44, and at the same time, coincidence between the decoded output and an output Q of a flip-flop 61 is detected by a gate 62, the output from which is provided via the OR gate 57 to the AND gate 58. As a consequency, the second clock signal $CK_2$ from the terminal 48 passes through the gate 58, and the data read from the address C of the operand file 24 and provided at the terminal 46 is set in the index register 28. Needless to say, in this while the input pattern read from the address C of the pattern file 11 is applied to the logical device 15 under test. While the pattern pause instruction is provided, its decoded output is applied from the terminal 59 to an inhibit gate 66 via a gate 65, as shown in FIG. 7, to inhibit the supply of the first clock signal $CK_1$ from a terminal 64 to the program counter 12, stopping it from stepping. The AND gate 65 is supplied with the output from the zero detector 45 via the terminal 52. Further, while the pattern pause instruction is provided, the output Q from the flip-flop 61 becomes high-level, and the output from the gate 62 also becomes high-level and provided via the OR gate 57 to the AND gate 58, so that the second clock signal $CK_2$ is applied via the gate 58 to the index register 28. Accordingly, each time the pattern pause instruction is executed, that is, each time the content of the address C is read out, the content of the index register 28 is subtracted. When the content of the index register 28 is reduced to zero, that is, when the content of the address C is read out n times, the output from the zero detector 45 becomes high-level, and the output from an inverter 67 becomes low-level to release the inhibit gate 66 from its inhibiting state, permitting the program counter 12 to advance to the next address C+1. Further, the pattern pause instruction is removed to make the terminal 59 low-level, and this is read by the second clock signal $CK_5$ in the flip-flop 61 in FIG. 4, resulting in the gate 62 being put in its open state. In this way, the pattern pause test can be conducted without involving the use of a dummy cycle.

Figure 6:
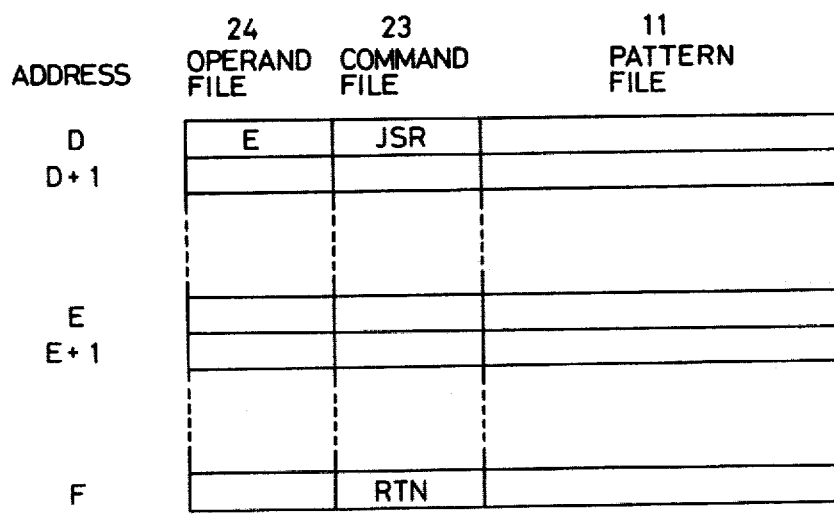
FIG. 6 is a diagram showing an example of storage of each of the command file and the operand file in a subroutine test.

With the arrangement shown in FIG. 1, a certain pattern group can be put into a subroutine. That is, it is possible to jump from a certain address to another, proceed therefrom to a predetermined address step by step and then return to the address next to the address before the jump. For example, as shown in FIG. 6, in the case of jumping from an address D to an address E, successively proceeding therefrom to an address F and then returning to an address D+1, the procedure therefor is as follows: A jump subroutine JSR is stored in the command file 23 at the address D, and the first address E of the subroutine is stored in the operand file 24 at the address D correspondingly. When reading of the pattern file 11 has proceeded to the address D, the jump subroutine JSR is decoded by the decoder 27 to derive the decoded output at its output terminal 71, which output is applied via an OR gate 72 to an AND gate 73, as shown in FIG. 7. The END gate 73 is supplied with the output from an arithmetic circuit 74 which adds one to the content of the program counter 12; therefore, the content D of the program counter 12 added with one, that is, D+1, is provided via the gate 73 and an OR gate 74 to the register 32. The decoded output at the terminal 71 is applied to an AND gate 77 via the OR gates 72 and 76. The second clock signal $CK_2$ is imparted from the terminal 48 to the register 32 via the AND gate 77, and as a result, the content D+1 of the arithmetic circuit 74 is set in the register 32.

Next, since the output of the jump subroutine JSR is applied to the terminal 71 of the address multiplexer 33 when the first clock signal $CK_1$ is generated, as shown in FIG. 5, this output is provided via the gate 54 to the gate 55; consequently, the destination address of the subroutine read from the operand file 24, which is provided from the terminal 46, is read in the program counter 12 via the gates 55 and 56. That is, the decoded output of the jump subroutine JSR derived at the terminal 71 is also provided to the OR gate 63. As a consequence, the content of the program counter 12 becomes the address E, and the pattern file 11 is read out at the address E. In this manner, the address of the program counter 12 jumps to the destination of the subroutine, and from there the subsequent addresses of the program counter 12 are each added with one. When the last address F of the subroutine is reached, a return instruction RTN stored in the command file 23 at the address F is decoded by the decoder 27 to derive the decoded output at its output terminal 78. In the multiplexer of FIG. 5, the decoded output is provided from the terminal 78 to an AND gate 81 via an OR gate 79. The AND gate 81 is supplied with the content of the register 32 from the terminal 82. Since the decoded output at the terminal 78 is also applied to the OR gate 63 in FIG. 7, the content D+1 of the register 32 is set in the program counter 12 from the AND gate 81 via the OR gate 56. Upon occurrence of the next first clock signal $CK_1$, the content of the address D+1 of the pattern file is read out, that is, the operation returns to the main routine.

The above subroutine can also be carried out a plurality of times. In such a case, for example, as shown in FIG. 8, a set instruction TSI for the index register is stored in the command file 23 at an address D-1, and the number of times n of the subroutine is stored in the operand file 24 at the address D-1. Accordingly, upon reading the content of the address D-1, the set instruction STI for the index register is decoded by the decoder 27 to provided the decoded output at its output terminal 42, and the data n read from the operand file 24 at that time is set in the index register 28. Next, when the content of the address D is read out, a jump subroutine index instruction JSI is stored in the command file 23 at the address D, and the destination address E of the subroutine is stored in the operand file 24 at the address D. The jump subroutine index instruction JSI is decoded by the decoder 27 to provide the decoded output at its output terminal 83, and the decoded output is applied to an AND gate 85 in FIG. 7. The AND gate 85 is also supplied with the content of the program counter 12, i.e. the address D in this case, and this is provided to the register 32 via the AND gate 85 and the OR gate 75. The decoded output at the terminal 83 is also applied to the OR gate 76. Accordingly, by the next second clock signal $CK_2$, the address D is set in the register 32. Upon occurrence of the next first clock signal $CK_1$, the decoded output at the terminal 83 is applied via the OR gate 54 to the gate 55, as described previously, so that the leading address E of the subroutine provided from the operand file 24 is set in the program counter 12, and the content of the address E is read out. Thereafter, the program counter 12 is successively added with one to execute reading of the pattern file 11.

At the last address F of the subroutine, when the return instruction RTN is read from the command file 23, the decoder 27 yields an output at its output terminal 78; since the content of the index register 28 is not zero, the address D of the register 32 is set in the program counter 12 by the output of the terminal 78. As a result, the content of the address is read out, whereby the jump subroutine instruction JSI is read out again. In this case, since the output from the zero detector 45 is not zero, and AND gate 84 remains open, the decoded output of the jump subroutine JSI is applied from the terminal 83 to the gate 55 via the gates 84 and 54, resulting in the destination address E of the subroutine read from the address D of the operand file 24 being set in the program counter 12. When the return instruction RTN is read out, the decoded output from the terminal 78 is applied via the OR gate 57 to the AND gate 58 to open it in FIG. 4, and the second clock signal $CK_2$ at the terminal 48 is provided to the index register 28 to subtract one from its content. Thereafter, the above operation is repeated. That is, the operation of executing the subroutines E to F from the address D, returning to the address D and then executing the subroutines E to F again is repeated, and for each cycle, the content of the index register 28 is subtracted by one. When the content of the index register becomes zero, that is, when the program counter 12 is set to the address D after the subroutines E to F have been executed n times, the output at the output terminal 52 of the zero detector 45 becomes high-level to close the gate 84 in FIG. 5. Even if the jump subroutine index instruction JSI is decoded to provide the decoded output at the terminal 83, the gate 84 is not opened, the address counter 12 is added with one at the address D and set to D+1, and the main routine proceeds.

Figures 9, 10:
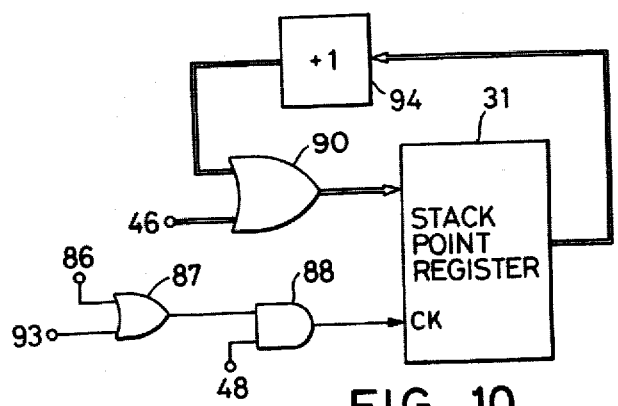
FIG. 9 is a diagram showing an example of storage of each of the command file and the operand file in the case of modifying one part of a fixed pattern.
FIG. 10 is a logical circuit diagram illustrating circuits around a stack point register 31.

Foe example, in the case of testing a microcomputer as the logical element 15 under test, an addition test is sometimes conducted by adding two numbers, while modifying one of them. In such a case, an instruction is substantially the same routine, but only the number to be modified is altered. In the prior art, no pattern loop test has been easily achieved where only minor modification of substantially the same routine is successively performed, and therefore numerous individual test patterns have had to be formed. In accordance with the embodiment of FIG. 1, a pattern loop can easily be formed through utilization of the stack point register 31. For instance, in the case of conducting a pattern loop test between the address A and B n times as shown in FIG. 9, test patterns of addresses next to H and I between the addresses A and B can be modified for each pattern in the following manner. That is, at a suitable address G before entering into the pattern loop, a set stack point instruction STP is loaded into the command file 23, and a leading address K for storing variable data, that is, data to be modified, is stored in the operand file 24 at the address G. When the content of the address G is read out, the decoder 27 yields the decoded output of the stack point instruction STP at an output terminal 86, and as shown in FIG. 10, the decoded output is provided via an OR gate 87 to an AND gate 88, which is also supplied with the second clock signal $CK_2$ from the terminal 48. On the other hand, the data read from the operand file 24 is applied from the terminal 46 to the stack point register 31 via an OR gate 90. Accordingly, by the second clock signal $CK_2$ at the time of the content of the address G being read out, an address K read from the operand file 24 is set in the stack point register 31. When an address A-1 is read out, data n-1 is loaded into the index register 28 in the same manner as described previously in respect of the pattern loop test, and then the program counter 12 advances step by step. When the program counter 12 reaches the address H, a variable part calling instruction JSP is read out and is decoded by the decoder 27 to derive at its output terminal 89 the decoded output, by which the output from the gate 72 in FIG. 7 is made high-level. As a result, data H+1 (i.e.) one, added by the arithmetic circuit 74, plus to the content H of the program counter 12 at that time) is supplied to the register 32 and set therein upon occurrence of the second clock signal $CK_2$. Following this, the content K of the stack point register 31 is written in the program counter 12. That is, in FIG. 5, the output from the output terminal 89 of the decoder 27 becomes highlevel and is applied to an AND gate 91, which is also supplied with the content of the stack point register 31 from a terminal 92. The output from the gate 91 is written by the first clock signal $CK_1$ in the program counter 12 via the OR gate 56. In FIG. 7, the decoded output at the terminal 89 is provided to the OR gate 63.

In the next operation cycle, the content of the address K of the pattern file 11 is read out to supply and the test pattern to the logical element 15 under test. At the address K of the command file 23, there is stored a return instruction ESP, which is read out and decoded by the decoder 27 to provide the decoded output at an output terminal 93. In FIG. 5, the decoded output is provided via the OR gate 79 to the gate 81, and in FIG. 7, the decoded output at the terminal 93 is provided to the OR gate 63, setting the content H+1 of the register 32 in the program counter 12 from the terminal 82 via the gates 81 and 56. In the next operation cycle, the content of the address H+1 is read out. At the same time, in FIG. 10, a terminal 93 is made high-level and the second clock signal $CK_2$ is provided to the stack point register 31, whose content K is added with one by a+1 arithmetic circuit 94 to provide K+1, which is set in the stack point register 31 via the OR gate 89.

Starting from an address H+1 again, the contents of the respective files are sequentially read out. When the program counter 12 reaches the address I, a variable readout instruction JSP is read again from the command file 23, and by the instruction, I+1 (i.e. one plus content of the program counter 12) is set in the register 32 in the same manner as described previously. Accordingly, in the next operation cycle, the content K+1 of the stack point register 31 is set in the program counter 12 to read therefrom the content of its address K+1. The address K+1 of the command file 23 has stored therein a return instruction RSP, by which the content I+1 of the register 32 is set in the program counter 12, and at the same time, the content of the stack point register 31 is added with one to become K+1. In the next operation cycle, the address I+1 is set in the program counter 12 to read out the content of the address I+1. Then, when the program counter 12 has advance step by step to reach the last address B of the pattern loop, the operation returns to the leading address A of the loop in the same manner as in the case of the operation for the pattern loop test described previously. After returning to the address A, the operation follows the addresses in the loop step by step, and when the address H is reached, the address H+1 is set in the register 32, after which an address K+2 of the stack point register 31 is set in the program counter 12. Consequently, a test pattern different from the previous one is executed when the address K+2 is read out. That is, for each execution of the addresses A to B, the contents of test patterns next to the addresses H and I are modified, so that for each pattern loop, its content can be partly modified. With the prior art, no pattern loop test can be achieved in such a case; therefore, a large capacity is needed for storing test patterns. This example permits a pattern loop test modifying its one part and markedly reduces the storage capacity. On top of that, such a test can be conducted without any dummy cycle.

Figure 11:
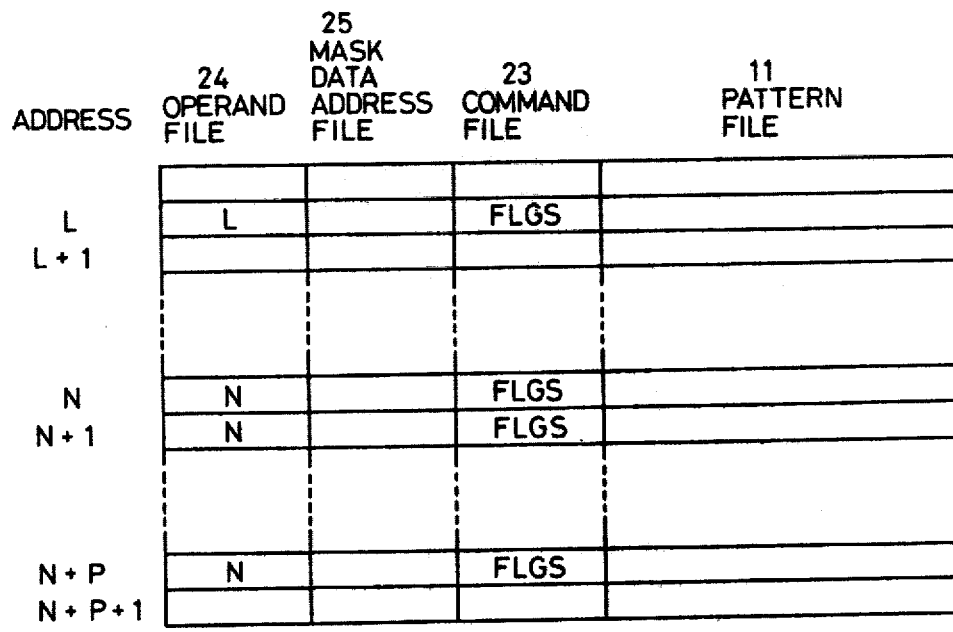
FIG. 11 is a diagram showing an example of storage of each of the command file and the operand file in coincidence detection control.

In the testing of the logical device 15 under test, there is the case that the operation does not proceed to the next step unless patterns derived from the logical device 15 in response to various input patterns thereto coincide with expected value patterns. Conversely speaking, some of logical elements under test are of the type that if the logical operation does not proceed to a certain state, they do not perform the next correct operation. For example, in a microcomputer, there is such a case. In the case where after the output pattern from the logical device under test coincides with the expected value pattern, the next test pattern is read out, a coincidence detecting instruction FLGS is stored in the command file 23 at an address L corresponding to the address L of the pattern file 11 requiring coincidence, and the address L of its own is stored in the operand file 24 at the address L, as shown in FIG. 11. When the coincidence detecting instruction FLGS is detected in the decoder 27, its output terminal 96 becomes high-level, by which in FIG. 1, the output from the logical device 15 under test and the expected value from the pattern file 11 are compared by the comparator 18, and coincidence in the comparator 18 is detected by the coincidence detector 38. In case of no coincidence being detected, as shown in FIG. 5, the decoded output at the terminal 96 is applied to an AND gate 98, and a low-level output at an output terminal 97 of the coincidence detector 38 is inverted by an inverter and then provided to the AND gate 98 to make its output high-level, which output is applied via the OR gate 54 to the AND gate 55. As a consequence, the content of the address L read from the operand file 24, that is, the content of the address L of its own, is set in the program counter 12. Until coincidence is detected by the coincidence detector 38, the program counter 12 stays at the address L; and when the output from the coincidence detector 38 becomes high-level after the detection of coincidence, the output from the AND gate 98 becomes low-level, and the program counter 12 steps to L+1.

Figure 12:
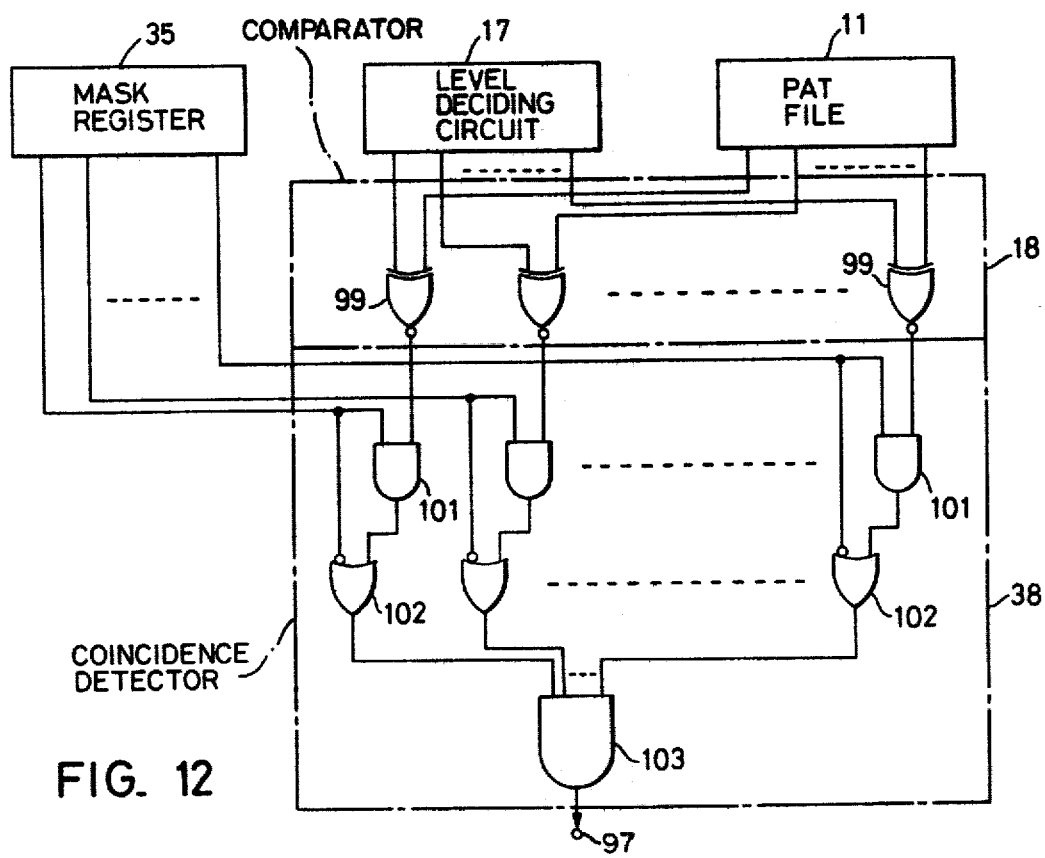
FIG. 12 is a diagram illustrating an example of a coincidence detector 28 in FIG. 1.

In this coincidence detection, it is possible to make such an arrangement that it is sufficent to detect coincidence in connection with only a predetermined one of outputs from the logical device 15 under test. For example, in FIG. 1, the mask data address file 25 is read out simultaneously with the test pattern, and by the address thus read out, the mask data file 34 is read out, and then the data thus read out is loaded into the mask register 35. In accordance with the content of the mask register 35, it is determined which one of the outputs from the logical device 15 under test is checked for coincidence by the coincidence detector 38. This coincidence detection is performed as shown in FIG. 12. That is, in the comparator 18, the corresponding bits of the expected value pattern from the pattern file 11 and the output from each terminal of the logical device 15 under test, which are provided from the level deciding circuit 17, are exclusive-OR'ed by an exclusive OR circuit 99, and NOT outputs of the exclusive OR's are taken out. Accordingly, in the case where both are coincident, the output from the exclusive OR circuit 99 becomes high-level, whereas in the case of non-coincidence, the output from the exclusive OR circuit 99 is low-level. The outputs from the exclusive OR circuit 99 are each supplied to a corresponding one of AND gates 101 in the coincidence detector 38. The AND gates 101 are respectively supplied with corresponding bits of the mask data from the mask register 35, and for example, for the bit to be detected for coincidence, a high level, that is, logic "1" is applied to the corresponding AND gate 101. The outputs from the AND gates 101 are respectively provided via individual OR gates 102 to a common AND gate 103. The OR gates 102 are each supplied with an inverted output of the corresponding bit of the mask register 35. That is, in the OR gates 102, for a bit not to be detected for coincidence, it's logic "0" is inverted to logic "1" to make the OR gates 102 high-level. The AND gates 101 detect whether or not the bits of the mask data are conident with the bits of the outputs from the exclusive OR circuit 99 respectively corresponding thereto, and the detected outputs are applied to the OR gate 102. Consequently, only when the bits designated by the mask data to be detected for coincidence are all coincident, the output from the AND gate 103 becomes high-level.

Thus, the mask data for determining for which bits the coincidence detection is to be conducted assumes a relatively limited value. Accordingly, if the mask data is stored at the same address as each input pattern file, the storage capacity for storing the mask data increases. However, by loading in the file 25 the mask data addresses indicating which mask data is to be adopted, as shown in this example, the number of bits for each address can be reduced; therefore, the storage capacity of the file can be reduced as a whole.

Thus, it is possible not only that the operation proceeds to the next step after coincidence is obtained in the lateral direction of the output data, that is, after the outputs simultaneously obtained coincide with the expected values corresponding thereto, but also that the operation proceeds to the next step when coincidence is obtained in the direction of steps being followed. For example, in FIG. 11 it is also possible to make such an arrangement that only when all the outputs from those of the terminals of the logical device 15 under test which are predetermined at addresses N to N+P always coincide with the expected values, the program counter 12 proceeds to the next address N+P+1. In such a case, the coincidence detecting instruction FLGS is set in the command file 23 at each of the addresses N to N+P, and the address N is loaded in the operand file 24 at the addresses corresponding thereto. When sequentially reading out and executing the contents of these addresses N to N+1, if coincidence is not detected between the output patterns from the logical element 15 under test based on the input patterns and the expected value patterns, the operation returns to the leading address N. Where coincidence is detected at all of the addresses N to N+P, the operation proceeds to the next step. With the present embodiment, it is possible to freely select the depth of the pattern requiring the coincidence detection, that is, the interval from the address N to N+P. Further, in this case, if it is determined by using the mask data which one or ones of the output terminals of the logical device 15 under test are selected, as described previously, the storage capacity of the file for the mask data can be reduced.

In such coincidence detection in the direction of the steps proceeding, there is no need of returning to the leading address N in the case of non-coincidence; namely, it is sufficient only to return to the address where coincidence has been obtained, taking the current test step into account. When the expected value pattern for the coincidence detection in the direction of the depth of the pattern is once determined, the nearest address to which the operation returns is automatically determined; therefore, it is sufficient to store to that effect in the operand file 24 at each address. Now, consider such a case as shown in FIG. 13 in which when coincidence is detected in the direction of depth from the address N to N+5, the operation is permitted to proceed to the next step; in terms of the expected values, when 1, 0, 1, 1, 1, 0 are obtained by the execution of the content of the addresses N to N+5 at the predetermined output terminals, the operation is permitted to proceed to the next step. N, N+1, N, N+2, N+2 and N+1 are respectively stored in the operand file 24 at the addresses N to N+5. With such an arrangement that in the case of non-coincidence, the operation does not always return to the leading address, the test time can be reduced.

By using, as the logical device 15 under test, an element pre-known to perform its normal operation and writting the resulting output patterns in the pattern file 1 at those areas corresponding to the input patterns, the expected value patterns can be formed in the pattern file 11. With such a method, the expected value patterns and the input patterns respectively corresponding thereto can be obtained immediately. Further, when non-coincidence, that is, a substandard product is detected in an ordinary test, the compared pattern derived from the comparator 18 at that time is written in the pattern file 11 at the address of the input pattern applied at that time, and after completion of the test, the pattern file 11 is called to make a comparison between the corresponding input pattern and the compared pattern, by which the error can be analyzed. As a fail memory for storing the compared pattern occurring such an error, the pattern file 11 can be used.

Such an arrrangement is made that the output pattern from the logical device 15 under test is taken out. For example, as depicted in FIG. 14, the output pattern from the logical element 15 under test is compared in a comparing part 105 of the comparator 18 with an expected value pattern provided from the terminal 13 of the pattern file 11, and the compared output in provided to an AND gate 106. While a signal indicating a fail copy made is applied to the AND gate 106 from a terminal 107, the AND gate 106 is opened to pass on the compared output from the comparing part to the output terminal of the comparator 18 via an OR gate 108. On the other hand, the output from the level deciding circuit 17 is also supplied to an AND gate 109, and when a signal indicating a copy mode is applied via a terminal 111 to the AND gate 109, the gate 109 is opened, through which the output pattern from the logical element 15 under test, decided by the level deciding circuit 17, is provided as the output from the comparator 18 via the OR gate 108. This is the case in which a logical element preknown to normally operate is used as the logical device 15 under test and the data obtained at its output terminals is used as the expected value patterns. The signals representing the fail copy mode and the copy mode, which are respectively applied to the terminals 107 and 111, are provided beforehand when this test equipment is actuated.

Moreover, also in either case of the fail copy mode or the copy mode for obtaining the expected value pattern, only preassigned bits are written in the pattern file 11 at the corresponding address, and for the other non-assigned bits, the input patterns read out at that time are selected and written again in the pattern file 11, by which the input pattern is held and the expected value pattern or the compared pattern can be obtained in the pattern file 11. Such selection of bits is carried out through utilization of the mask data of the mask register 35. For example, as shown in FIG. 15, the outputs from the comparator 18 and the pattern file 11 are provided to the data multiplexer 39, in which output bits from the comparator 18 are each applied to a corresponding one of AND gates 112, whereas output bits from the pattern file 11 are each supplied to a corresponding one of AND gates 113. The bits of the mask data of the mask register 35 are each imparted directly to a corresponding one of the AND gates 112 and an inverted signal of each of the bits is applied to a corresponding one of the AND gates 113. The corresponding ones of the AND gates 112 and 113 provide their outputs through an OR gate 114. As a consequence, by the mask data applied to the mask register 35, the output from the comparator 18 is produced for the bits of logic "1", and for the bits of logic "0", the output from the pattern file 11 is provided. In this way, desired bits are selected; namely, desired bits of the output from the logical element 15 under test or the compared output from the comparator and the input pattern from the pattern file 11 are written in the pattern file 11 at the same addresses location. Thus, all necessary patterns, or compared output patterns corresponding to the input patterns, can be obtained in the pattern file 11 while reserving the input patterns. Consequently, there is no need of re-storing the input patterns after obtaining the expected value patterns or providing a separate memory for storing all the expected value patterns. The same is true of the file fail copy mode. In either case, when the mask data for determining which bits of each pattern are written in the pattern file 11 is stored in the pattern file 11 at each address, the capacity of the memory therefor is large; but in the case where the mask data file 34 is separately provided and its addresses are each stored corresponding to one of the addresses of the pattern file 11, as in the present example, the desired purpose can be attained with a small storage capacity.

Further, as described previously, there is the case that the logical device 15 under test is a logical element whose terminals are used both as input and output terminals. In such a case, input/output control data for selectively switching the terminals from input to output terminals or vice versa is loaded in the input/output control data file 36 in FIG. 1, and addresses for reading it are stored in the input/output control address file 26 which is read out simultaneously with each address of the pattern file 11. With such an arrangement, it is possible to reduce the storage capacity for the input/output control data as compared with that in the case where the input/output control data is stored in the pattern file 11 at each address. The input/output control data is applied to the register 37, and the corresponding bits are each provided to one of the bits of the input waveform applying circuit 16 for the logical device 15 under test; for the terminals designated as input terminals, the output from the input waveform applying circuit 16 is applied to designated ones of the terminals of the logical device 15 under test, but for the terminals designated as output terminals, the output terminals of the input waveform applying circuit 16 corresponding thereto are made to have a high input impedance, and the outputs from these output terminals are supplied to the level deciding circuit 17. In this manner, the storage capacity for the input/output control data can be reduced, and the logical device 15 under test can successively be tested without using a dummy cycle. It is also possible to preselect comparison patterns by the mask data at the input/output side of the comparator 18 and to selectively output the patterns to be compared or compared ones.

It will be apparent that many modifications and variations may be effected without departing from the scope of the novel concepts of this invention.

What is claimed is:

1. A logical device test system, for connection to a desired logical device under test, which comprises:
    a pattern file having stored therein a test pattern composed of at least an input pattern and an expected value pattern;
    a program counter, connected to said pattern file, which addresses said pattern file;
    means, connected to said pattern file and to the logical device under test, for applying said input pattern of the one of said test patterns which is addressed by said program counter to a logical device under test;
    a comparator, connected to said pattern file and to the logical device under test, which compares the output from the logical device under test with the expected value pattern of the one of said test patterns which is addressed by said program counter, wherein the comparison performed by said comparator detects whether the logical device under test is acceptable or not;
    a command file, connected to said program counter, having stored therein an instruction for controlling the sequence of pattern generation and addressed by the program counter to be accessed simultaneously with the pattern file;
    an operand file, connected to said command file and to said program counter, having stored therein data to be used by the instruction in the command file at the corresponding address, said operand file being addressed by said program counter to be accessed simultaneously with the pattern file;
    a decoder, connected to said command file, for decoding the instruction read from the command file; and
    pattern generation sequence control means, connected to said decoder, to said operand file, and to said program counter, for controlling the program counter in accordance with the decoded result from said decode r to control the sequence of pattern generation;
    whereby a desired sequence of input patterns is uninterruptedly applied to the logical device under test.

2. A logical device test system according to claim 1, wherein said pattern generation sequence control means comprises:
    an index register, connected to said decoder and to said operand file, which, upon receiving a decoded output corresponding to a first pattern pause instruction which has been read from said command file, loads the numerical value which has been read from said operand file simultaneously with said first pattern pause instruction and which corresponds to said first pattern pause instruction;
    a zero detector, connected to said index register, which decides whether the content of said index register is zero or not, upon each execution of the pattern pause instruction;
    means, connected to said index register and to said zero detector, for subtracting, upon each execution of the pattern pause instruction, the content of the index register by one if the zero detector has not detected that the index register content is zero; and
    means, connected to the zero detector and to the program counter, for preventing the program counter from incrementing when said pattern pause instruction has been read out and said zero detector does not yet detect zero.

3. A logical device test system according to claim 1, wherein said pattern generation sequence control means comprises:
    an index register, connected to said decoder and to said operand file, which, upon receiving a decoded output corresponding to a data set instruction which has been read from said command file, loads the numerical value which has been read from the operand file simultaneously with said data set instruction;

a zero detector, connected to said index register, which detects whether the content of said index register is zero or not, when said pattern loop instruction has been read from the command file; and means, connected to said program counter, to said operand file, and to said zero detector, for loading in said program counter an address read from said operand file when said zero detector has not yet detected zero.

4. A logical device test system according to claim 3, wherein said command file may contain both data set and pattern loop instructions, and wherein first and second index registers are provided respectively corresponding to said data set and pattern loop instructions.

5. A logical device test system according to claim 1, wherein said pattern generation sequence control means comprises:

a register, connected to said decoder and to said program counter, which, upon receiving a decoded output corresponding to a subroutine instruction which has been read from said command file, an address equal to one plus the content of the program counter at the time when said subroutine instruction is read out;

means, connected to said decoder, said operand file, and said program counter, for setting an address read from said operand file in said program counter upon receiving said decoded output corresponding to said subroutine instruction; and means, connected to said register, said program counter, and said decoder, for setting the content of said register in said program counter upon receiving a decoded output corresponding to a return instruction which has been read from the command file after said subroutine instruction has been read out.

6. A logical device test system according to claim 5, which further comprises:

an index register connected to said decoder and said operand file, which, upon receiving a decoded output corresponding to a data set instruction which has been read from said command file, loads the numerical value which has been read from the operand file simultaneously with the data set instruction;

a zero detector, connected to said index register, which detects whether the content of said index register is zero or not, upon each read-out of said subroutine instruction; and means, connected to said decoder and to said index register, for subtracting, upon each said subroutine instruction, one from the content of the index register if said zero detector has not yet detected zero; and wherein, when said subroutine instruction is detected, the content of said program counter is set in said register.

7. A logical device test system according to claim 3, which further comprises:

a stack point register, connected to said decoder and said operand file, which, upon receiving a decoded output corresponding to an address set instruction which has been read from said command file, loads the address which has been read from said operand file simultaneously with said address set instruction;

a register, connected to said decoder and to said program counter, which, upon receiving a decoded output corresponding to a jump stack instruction which has been read from the command file, loads an address, comprising one plus the content of the program counter at the time of said jump stack instruction being read out, after the address from which said data set instruction is read out;

means, connected to said decoder, said stack point register, and said program counter, for setting the content of said stack point register in said program counter, upon receiving said decoded output corresponding to said jump stack instruction;

means, connected to said register, said program counter, and said decoder, for setting the content of said register in said program counter upon receiving a decoded output corresponding to a return stack instruction which has been read from said command file; and means, connected to said stack point register and said decoder, for adding one to the content of said stack point register upon receiving said decoded output corresponding to said return stack instruction.

8. A logical device test system, for connection to a desired logical device under test, which comprises:

a pattern file having stored therein a test pattern composed of at least an input pattern and an expected value pattern;

a program counter, connected to said pattern file, which addresses said pattern file;

means, connected to said pattern file and to the logical device under test, for applying said input pattern of the one of said test patterns which is addressed by said program counter to a logical device under test;

a comparator, connected to said pattern file and to the logical device under test, which compares the output from the logical device under test with the expected value pattern of the one of said test patterns which is addressed by said program counter, wherein the comparison performed by said comparator detects whether the logical device under test is acceptable or not;

a mask data address file, connected to said program counter, having mask data addresses stored therein, said mask data address file being addressed by said program counter to be accessed simultaneously with said pattern file;

a mask data file, connected to said mask data address file, having stored therein mask data representing whether each of the terminals of the logical device under test is selected or not, said mask data file being addressed by a mask data address read from said mask data address file; and processing means, connected to the logical device under test and to said mask data file, for selectively processing the outputs from the terminals of the logical device under test in accordance with said mask data read from said mask data file, whereby the logical device under test is tested only with respect to a selected subset of its output terminals.

9. A logical device test system according to claim 8, wherein said processing means comprises:

means for making a comparison, by the comparator, between the outputs from only those terminals of the logical device under test selected in accordance with said mask data, and the respective corresponding expected value pattern.

10. A logical device test system according to claim 8, wherein said processing means comprises:

means for extracting the outputs from only those terminals of the logical device under test which have been selected by said mask data, wherein said processing means includes means for writing said extracted outputs together with the corresponding input pattern applied to the logical device under test, in said pattern file at an address assigned in accordance with the content of said program counter at the time of said input pattern being read out, and wherein a preknown accepted logical device is used as the logical device under test.

11. A logical device test system according to claim 8, wherein said processing means detects coincidence between the output from those terminals of the logical device under test which have been selected by the mask data read from said mask data file and the expected value pattern, and further comprising:

a command file, connected to said program counter, having stored therein a coincidence detecting instruction and addressed by said program counter to be accessed simultaneously with the pattern file;

an operand file, connected to said program counter, having stored therein a destination address of a jump in the case of the coincidence being not detected, and addressed by said program counter to be accessed simultaneously with said pattern file, and means, connected to said operand file and said program counter, for setting the address read from said operand file in said program counter if coincidence is not detected.

12. A logical device test system according to claim 11, wherein said coincidence detecting instruction is stored in said command file at a plurality of successive addresses.

13. A logical device test system according to claim 12, wherein said operand file has stored therein an address, to which operation returns if coincidence is not detected, equal to one plus the address where the coincidence is detected.

14. A logical device test system according to claim 8, which further comprises:

an input/output control address file, connected to said program counter, having stored therein an input/output control address and addressed by the program counter to be accessed simultaneously with the pattern file;

an input/output control data file, connected to said input/output control address file having stored therein data representing whether or not the input pattern is applied to the logical device under test for each of its terminals, said input/output control data file being addressed by the input/output control address read from said input/output control address file; and means, connected to the logical device under test and to said input/output control data file, for controlling the application of the input pattern to the terminals of the logical device under test in accordance with the read-out input/output control data.

15. A logical device test system according to claim 9, which further comprises means for storing both the compared output from said processing means and the input pattern applied to the logical device under test in said pattern file, at an address assigned by an address read from said program counter at the time of the input pattern being read out.

* * * * *